(12) United States Patent
Regnier

(10) Patent No.: US 8,393,917 B2
(45) Date of Patent: Mar. 12, 2013

(54) CONNECTOR SYSTEM WITH AIRFLOW CONTROL

(75) Inventor: Kent E. Regnier, Lombard, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 13/279,917

(22) Filed: Oct. 24, 2011

(65) Prior Publication Data

US 2012/0099275 A1  Apr. 26, 2012

Related U.S. Application Data

(60) Provisional application No. 61/406,517, filed on Oct. 25, 2010.

(51) Int. Cl.
*H01R 13/00* (2006.01)

(52) U.S. Cl. ....................................................... 439/485

(58) Field of Classification Search .................. 439/485, 439/607.01; 174/384; 361/690
See application file for complete search history.

(56) References Cited

U.S. PATENT DOCUMENTS

| | | | |
|---|---|---|---|
| 6,716,039 B1 * | 4/2004 | Peloza et al. | 439/83 |
| 6,731,519 B1 * | 5/2004 | Hwang | 361/818 |
| 7,641,515 B1 * | 1/2010 | Szczesny et al. | 439/607.01 |
| 2004/0077193 A1 * | 4/2004 | Peloza et al. | 439/83 |
| 2012/0058670 A1 * | 3/2012 | Regnier et al. | 439/485 |

* cited by examiner

*Primary Examiner* — Chandrika Prasad
(74) *Attorney, Agent, or Firm* — Stephen L. Sheldon

(57) ABSTRACT

A connector assembly includes a cage with a plurality of ports for receiving modules. An air passage is associated with each port and extends from a rear wall of the cage through a front face of the cage. The air passage way is configured to provide relatively consistent airflow regardless of whether or not a module is inserted into the corresponding port.

12 Claims, 13 Drawing Sheets

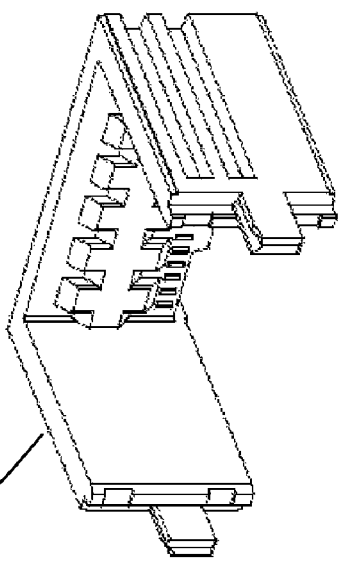
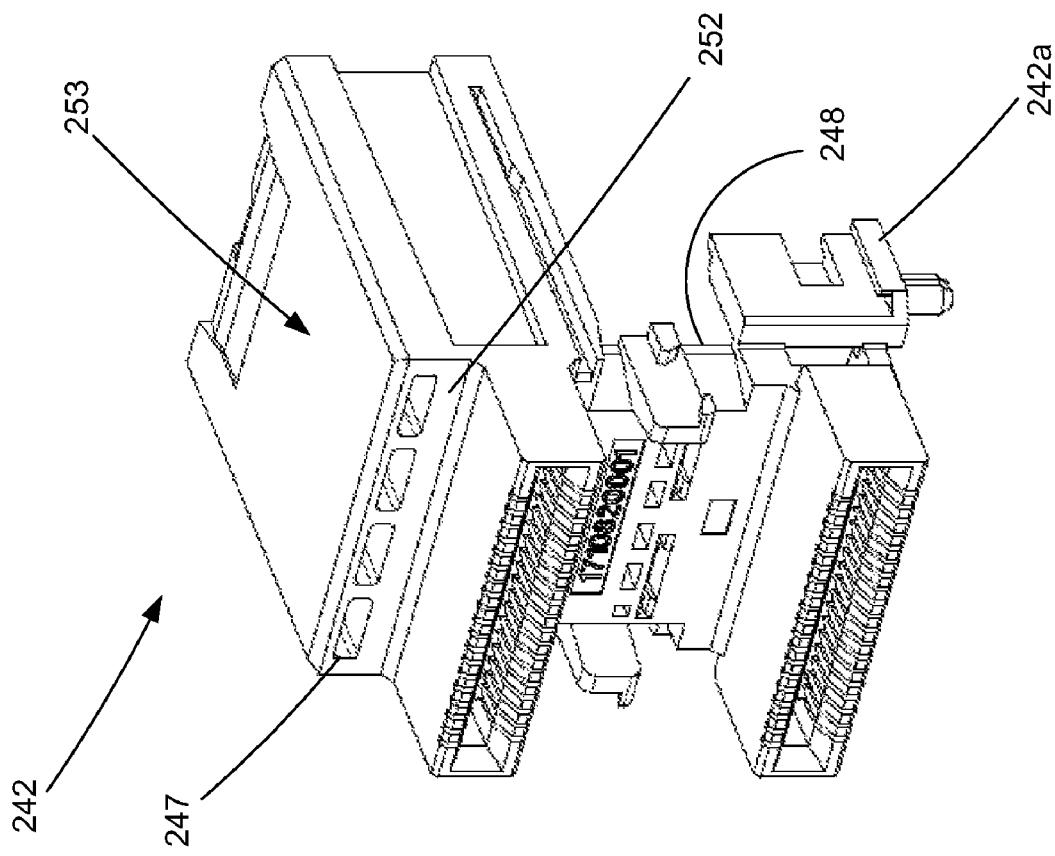
FIG. 12

CONNECTOR SYSTEM WITH AIRFLOW CONTROL

RELATED APPLICATIONS

This Application claims priority to U.S. Provisional Application No. 61/406,517, filed Oct. 25, 2011, which is incorporated herein by reference in its entirety.

FIELD OF THE INVENTION

This disclosure relates generally to high speed connector systems and, more particularly, to airflow control through a high speed pluggable connector system.

BACKGROUND

In computer systems, such as servers, routers and other data handling devices, there is a trend towards increased system speeds and performance as well as greater densities of components. In general, the increased performance and higher densities result in an increased need for cooling of the servers and their components. The data handling devices typically cool their components by drawing or forcing air through the components, such as a chassis of a server, through the use of fans or other air moving devices.

Data transmission to and from the data handling devices often occurs through cable assemblies that are pluggable into such data handling devices. These cable assemblies typically utilize a pair of plug connectors interconnected by a length of cable. The plug connectors often take the form of electronic, pluggable modules that are inserted into an opening in a data handling device so as to mate with and engage an opposing mating connector. The connectors are mounted to a circuit board and a cage or shield typically surrounds the connectors. The cage defines a hollow enclosure that envelops the connectors and, within the enclosure, a module-receiving channel or port is defined so that a module can be inserted into the channel. In operation, this allows the two data handling devices to communicate with each other at high data rates.

As system speeds continue to increase, it has become desirable to cool the pluggable modules that are received within the connector systems. However, the cage, while providing increased shielding, typically also results in less airflow. Thus it would be useful to improve airflow through a connector assembly. In addition, since all of the ports of a connector system many not have modules inserted therein, airflow through the connector system may be inconsistent and result in overheating of some of the modules. It would be desirable for approximately equal airflow to flow through each port regardless of whether the port has a module therein, so that each module receives sufficient airflow for cooling.

SUMMARY OF THE INVENTION

A connector assembly includes a cage with a port and a housing positioned in the cage. The cage has a rear wall and a front face. An air passage associated with the port extends between the rear wall and the front face. The air passage includes an airflow restrictive section and is configured so that an airflow impedance of the air passage does not increase in an undesirable manner upon insertion of a module into the port. In an embodiment, the cage includes a first and second ports, each of the ports having a different air passage associated therewith, each air passage having a airflow impedance and configured so that upon insertion of module into one of the first and second port, the airflow impedance does not increase by more than 50 percent.

BRIEF DESCRIPTION OF THE DRAWINGS

Various other features and attendant advantages will become more fully appreciated as the same becomes better understood when considered in conjunction with the accompanying drawings in which like reference characters designate the same or similar parts throughout the several views, and in which:

FIG. 12 illustrates a partial perspective view of an embodiment of a housing suitable for use in a connector assembly.

DETAILED DESCRIPTION OF THE ILLUSTRATED EMBODIMENTS

The following description is intended to convey the operation of exemplary embodiments to those skilled in the art. It will be appreciated that this description is intended to aid the reader, not to limit the invention. As such, references to a feature or aspect are intended to describe a feature or aspect of an embodiment of the invention, not to imply that every embodiment must have the described characteristic. Furthermore, it should be noted that the depicted detailed description illustrates a number of features. While certain features have been combined together to illustrate potential system designs, those features may also be used in other combinations not expressly disclosed. Thus, the depicted combinations are not intended to be limiting unless otherwise noted.

Figure 1:
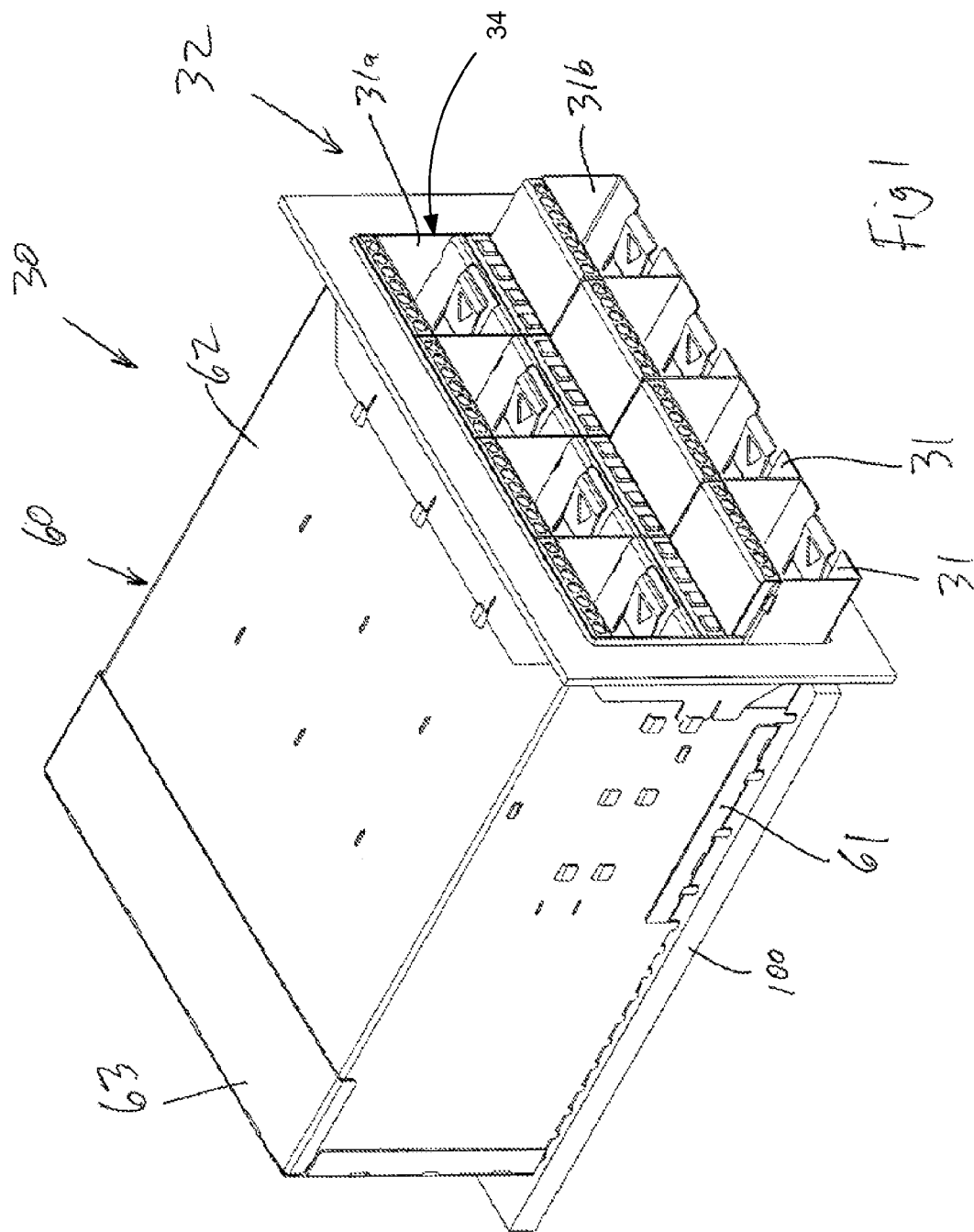
FIG. 1 illustrates a perspective view of an embodiment of a connector assembly.
Figure 2:
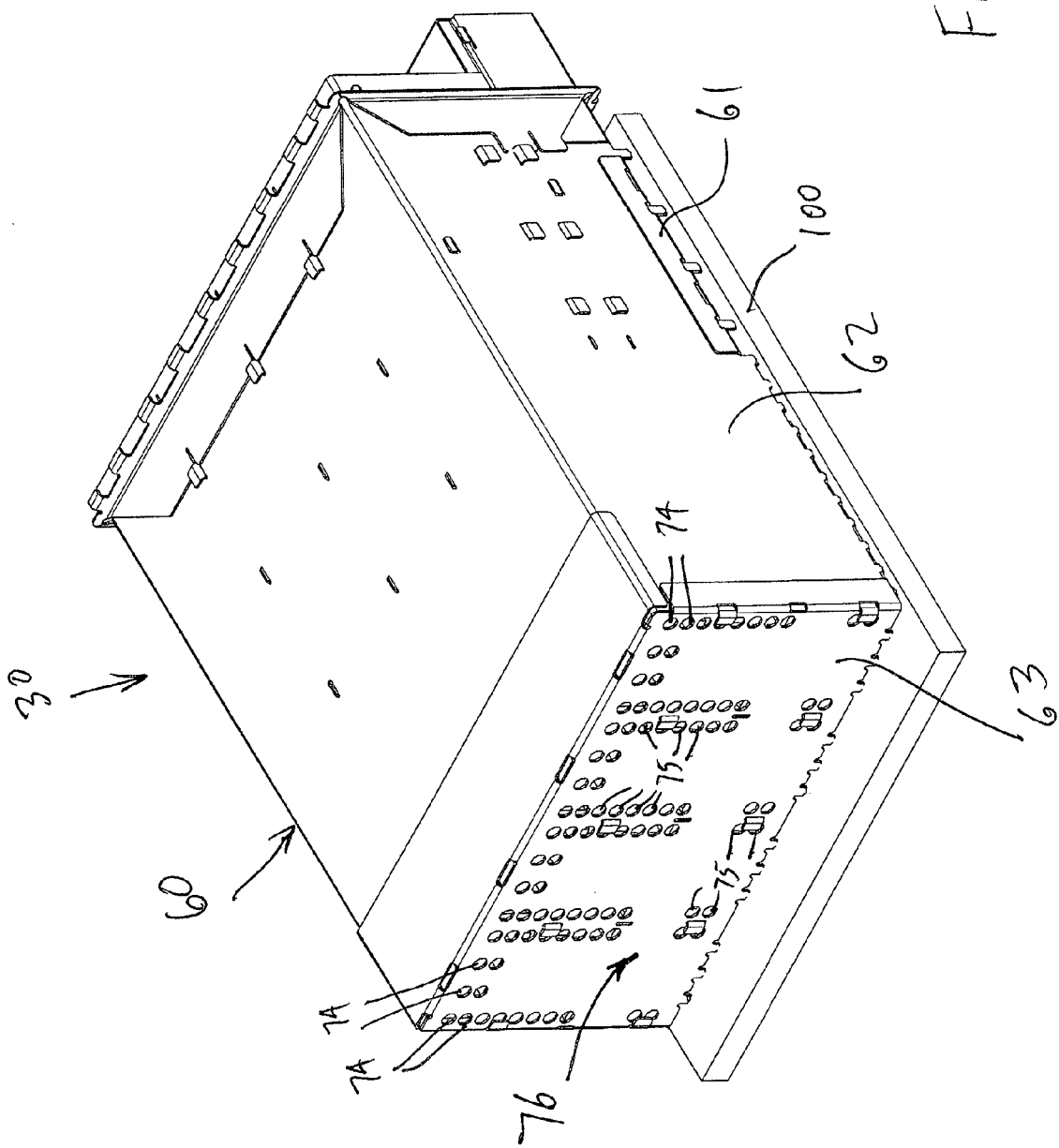
FIG. 2 illustrates another perspective view of the embodiment depicted in FIG. 1.
Figure 3:
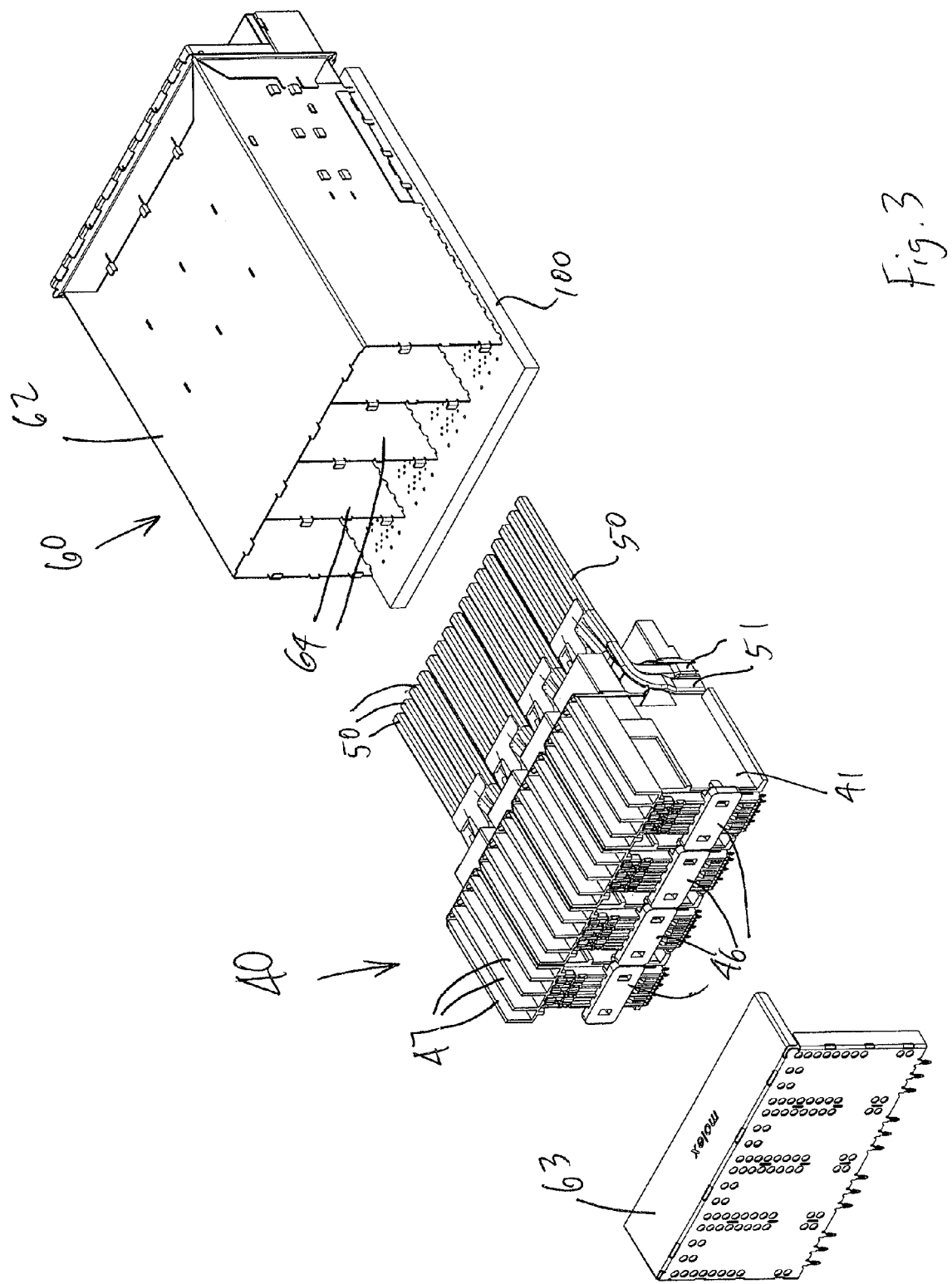
FIG. 3 illustrates a partially exploded perspective view of the embodiment depicted in FIG. 2.
Figure 10:
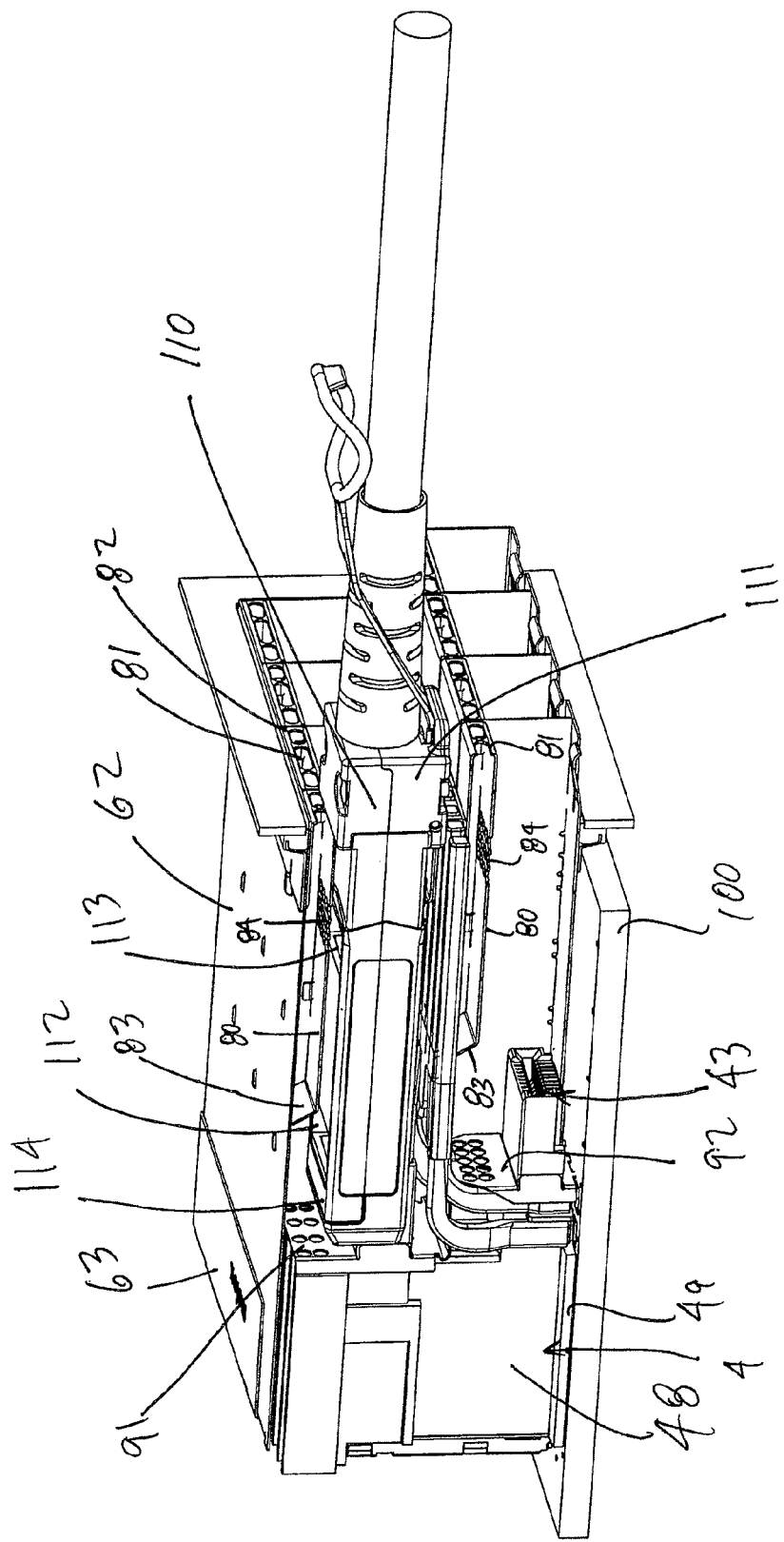
FIG. 10 illustrates the embodiment depicted in FIG. 9 but with a module inserted into a port.

Referring to FIGS. 1-2, a connector assembly 30 is illustrated mounted on a circuit board 100. The connector assembly 30 is depicted as providing a 2×4 array of ports 31, meaning it has two stacked ports 31, a top port 31*a* stacked above a bottom port 31*b* and four columns of the stacked ports. It should be noted, however, that the connector assembly 30 could use other combinations of arrays (e.g., 2×1, 2×2, 2×6, etc.). The top and bottom ports 31*a,* 31*b* each have an opening 34 in a front face 32 and may be aligned in the direction of insertion of the modules or may be offset from each other. For example, as depicted in FIGS. 1-11 the bottom port 31*b* is offset forward of the top port 31*a.* The benefit of providing such an offset is that it provides additional space for the airflow through the bottom port 31b. However, if space is at a premium then the offset can be omitted and less airflow can be provided through the bottom port 31b. Furthermore, while the connector assembly 30 is depicted in a stacked configuration, the bottom port could be omitted and an embodiment where each row included a single port could be provided (e.g., 1×N where N is some integer with a value of 1≦N≦16) with each port 31 being configured in a manner so as to provide the desired air passage between the rear wall of the cage and the opening of the port. As can be appreciated, each port is configured to receive a module, such as module 110 (as shown in FIG. 10).

The modules 110 to be received within each port may be transceivers including various components (not shown) within a housing 111. The mating interface of the module is typically an end of a circuit board having conductive traces but is not so limited. As system performance has increased, management of thermal issues and, specifically dissipation of heat, have been significant issues. In order to increase the airflow through the module and thus the cooling of the components within the modules, openings or holes 112, 113 may be provided in the module. As depicted, for example, module 110 includes a first opening 112 generally adjacent its leading edge 114 and a second opening 113 generally towards the middle of the module.

Assembly 30 includes a subassembly 40 and a cage 60. Subassembly 40 includes a plurality of stacked connectors 41, each associated with a pair of vertically stacked ports 31. An optional pair of light pipes 50 is associated with each port and is generally positioned in a horizontal space between the upper and lower ports of each pair in order to provide information to users of the computer system. LED's or other light transmitting devices may be mounted on or adjacent circuit board 100 and aligned with the downwardly extending portions 51 of the light pipes adjacent circuit board 100.

Figure 4:
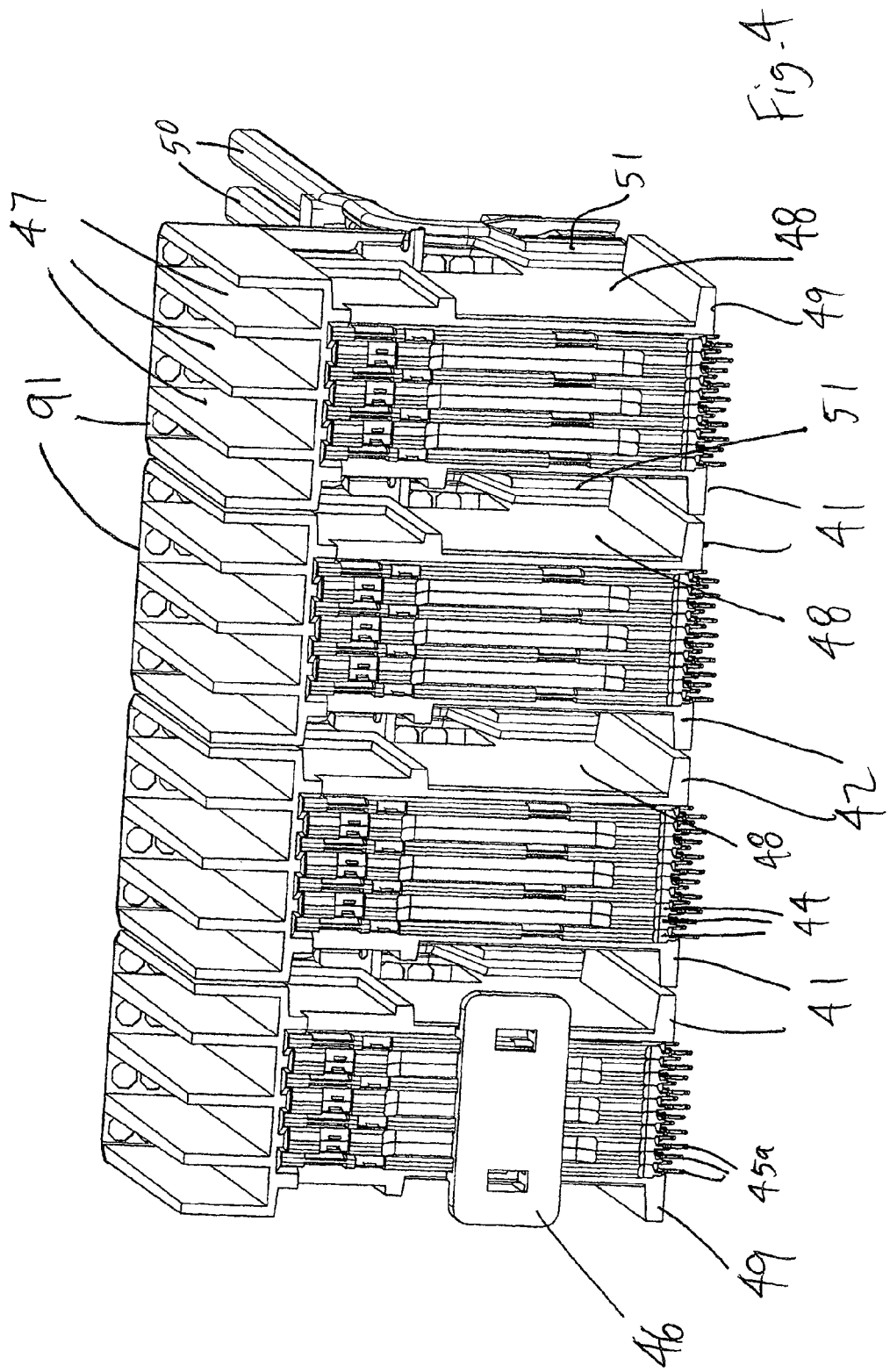
FIG. 4 illustrates a partial perspective view of an embodiment of a housing.
Figure 5:
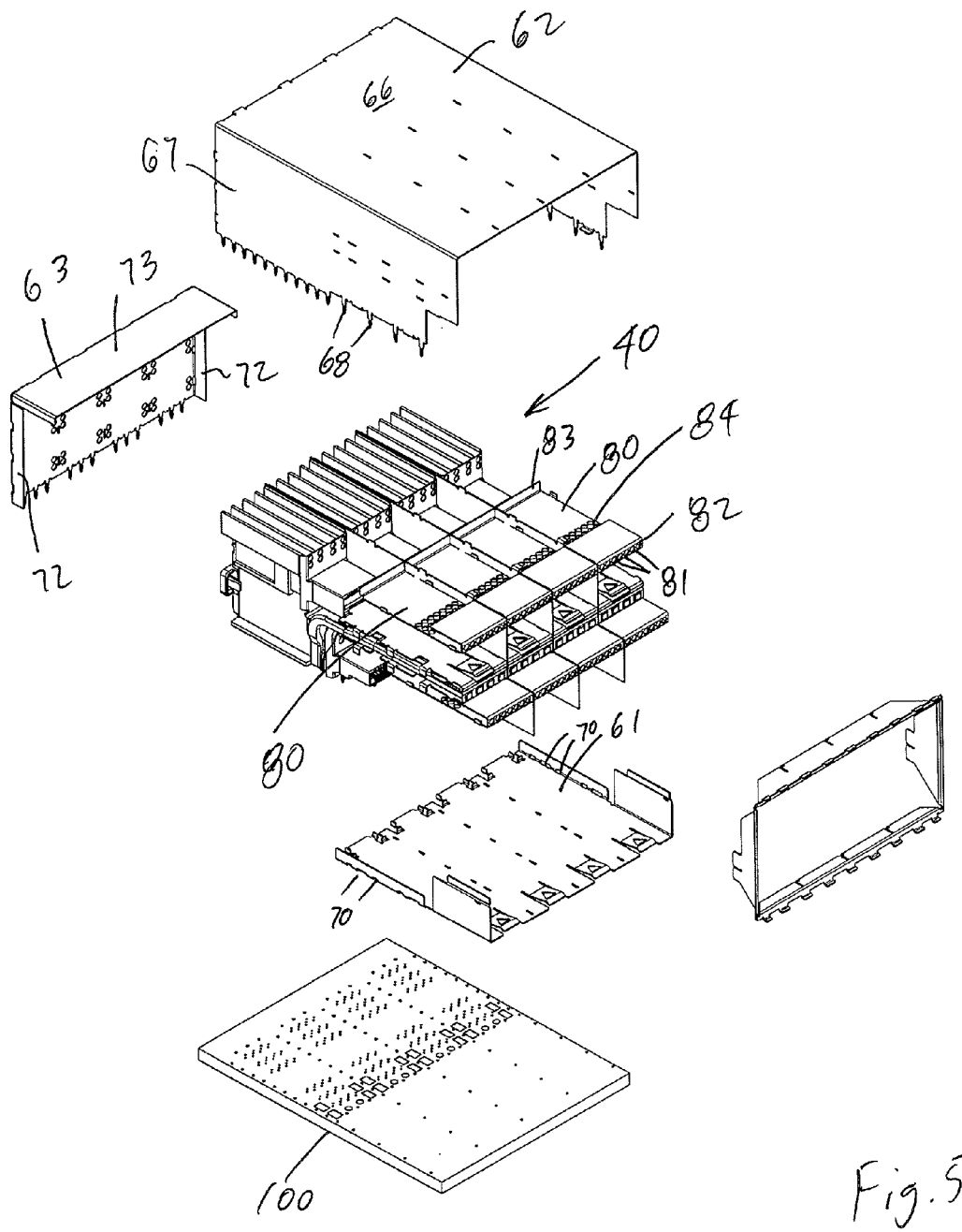
FIG. 5 illustrates a partially exploded perspective view of an embodiment of a connector assembly.
Figure 6:
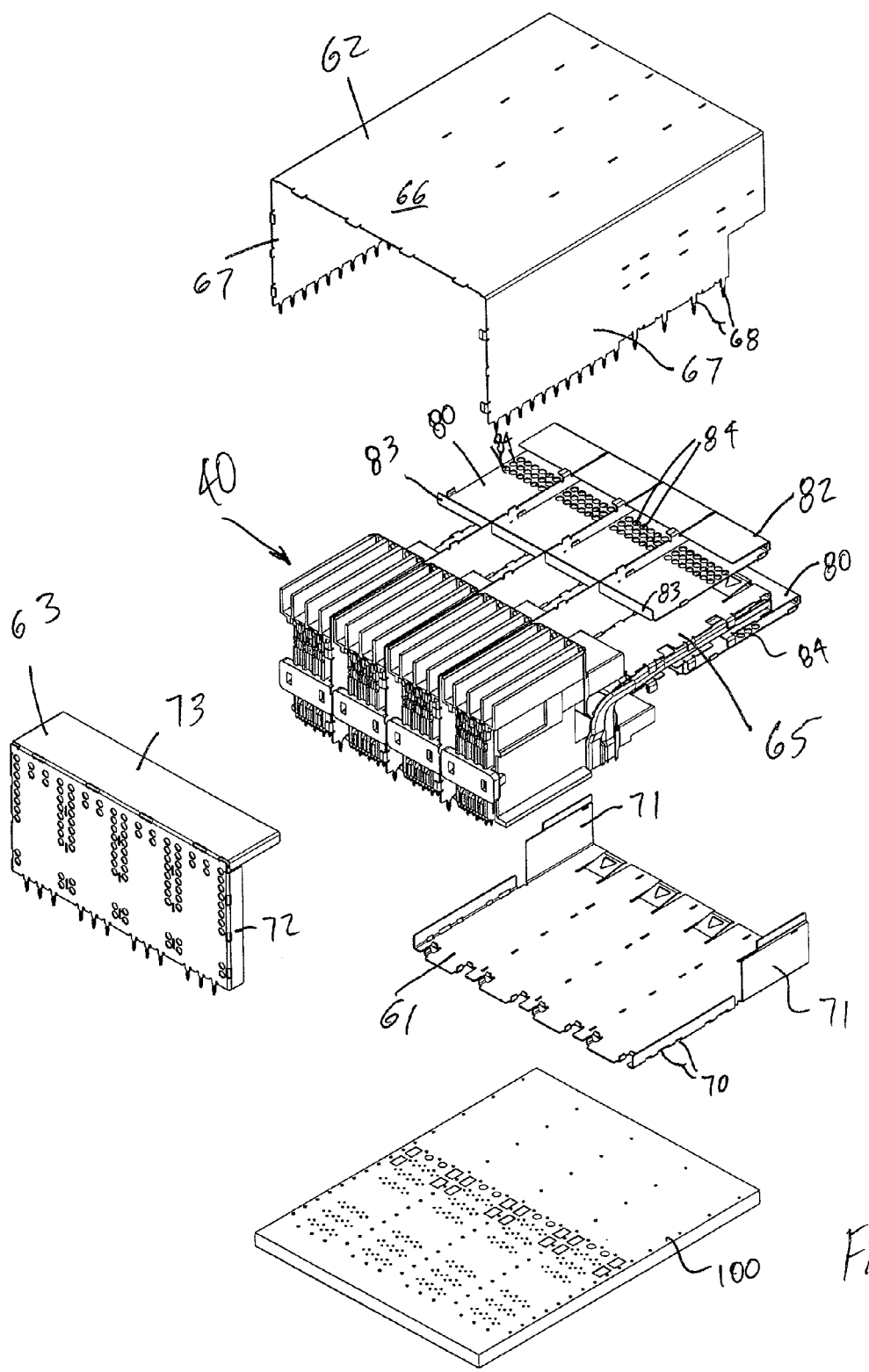
FIG. 6 illustrates another perspective view of the embodiment depicted in FIG. 5.

Each connector 41 has a housing 42 and a card slot 43 aligned with the corresponding port. As depicted, housing 42 supports a plurality of wafers 44 that support terminals 45 therein. Each terminal 45 has a tail 45a for mounting to the circuit board 100 and a contact 45b located in one of the card slots 43. In an embodiment, each wafer can provide at least two terminals, one positioned in one card slot and the other positioned in the other card slot. An optional strap 46 may be provided to secure the wafers 44 within each housing 42. Each housing 42 includes a plurality of air channels 47 at an upper region thereof whereby air passes over the top of the modules 43. In addition, housings 42 can be optionally dimensioned and configured so as to be spaced apart in order to create lateral air channels 48 that permit air to flow past each housing on opposite sides thereof. Lower webs 49 may be provided extending laterally from the lower surfaces of each housing 42 in order to assist in properly positioning the housings to create the desired lateral air channels 48. As a result, as best seen in FIG. 4, air may pass around housings 42 on opposite lateral sides and along the top surface thereof.

Cage 60 has a bottom wall 61, a cover 62, which includes a top wall 66 and two side walls 67, a rear wall 63, three interior walls 64 and a four horizontal dividers 65. The bottom wall 61, top wall 66, side walls 67 and rear wall 63 cooperatively define the outer perimeter of an enclosure that encloses the connectors 61 and defines an interior space of the assembly 100. This interior space is further divided into sub-spaces by each of the vertical interior walls 64, with each interior wall separating two such sub-spaces. Each horizontal internal divider 65 (FIG. 6) likewise serves to divide the interior sub-spaces into upper and lower ports 31a, 31b.

The cover 62 may include tail portions 68 in the form of compliant pins formed as part of the cover 62 and which are received within vias, or other openings in circuit board 100 so as to connect the shielding cage to ground circuits on the circuit board. Some of the tail portions 68 may extend through slots 70 in the base member 61. The base member 61 may include sidewall portions 71 that engage the cover 62 to form a hollow enclosure.

The rear wall 63 of the shielding cage 60 may also include sidewalls 72 and a top wall 73 that extend forwardly and engage the cover 62. Rear wall 63 may be assembled onto the cover 62 after the internal component subassembly 40 is inserted into the hollow enclosure formed by the cover 62 and bottom wall 61. Rear wall 63 includes a plurality of apertures therein to permit the passage of air. More specifically, rear wall 63 includes two horizontal rows of apertures 74 adjacent the top of rear wall 63. Apertures 74 are aligned with upper air passages 47 that extend along the top of housing 42. Vertical rows of additional apertures 75 extend downward and are aligned with the lateral air channels 48 that extend around housing 42. Although section 76 of rear wall 63 does not include any apertures therein due to the position of straps 45, if the straps were not utilized, additional apertures could be provided in rear wall 63 to increase airflow, if desired. In order to maintain the EMI functionality of cage 60, apertures 74, 75 may be dimensioned so as to be small enough relative to the frequencies within the system in which assembly 30 is used so that EMI does not escape from the cage 60 through apertures 74, 75.

Each port 31 can include an airflow member 80 that is positioned along an upper surface thereof that is formed as a portion of the cage 60. The airflow member helps direct air into or out of module 110. More specifically, each airflow member includes a plurality of openings 81 along the front face 32 of assembly 30 and a surface 83 at an opposite end of member 80. The surface 83 is generally aligned with edge 114 of first or front opening 112 of module 110 in order to redirect air traveling past connector housing 42. Although depicted as being angled rearwardly, surface 83 could be vertical or inclined towards front face 32 of assembly 30. As air passes the housing 42 and port 31, it is redirected downward towards or into the front opening of module 112. A plurality of holes 84 are located between the two ends of airflow member 80 so as to be aligned with the second opening 113 of module 110 to provide a path for air to exit from the second opening of the module. In order to maintain the performance of the cage 60, holes 84 may be dimensioned so as to be small enough relative to the frequencies within the system so that EMI does not escape from the cage 60 through holes 84. In other words, by properly dimensioning holes 84, EMI will not escape from assembly 30 despite openings 112, 113 in module 110 and the openings 81 in the airflow member 80. Airflow member 80 can interact with the structure of cage 60 above it (cover 62 in the case of the upper ports 31a and the horizontal internal divider 65 in the case of the lower ports 31b) in order to form a conduit directing air as desired.

Figure 7:
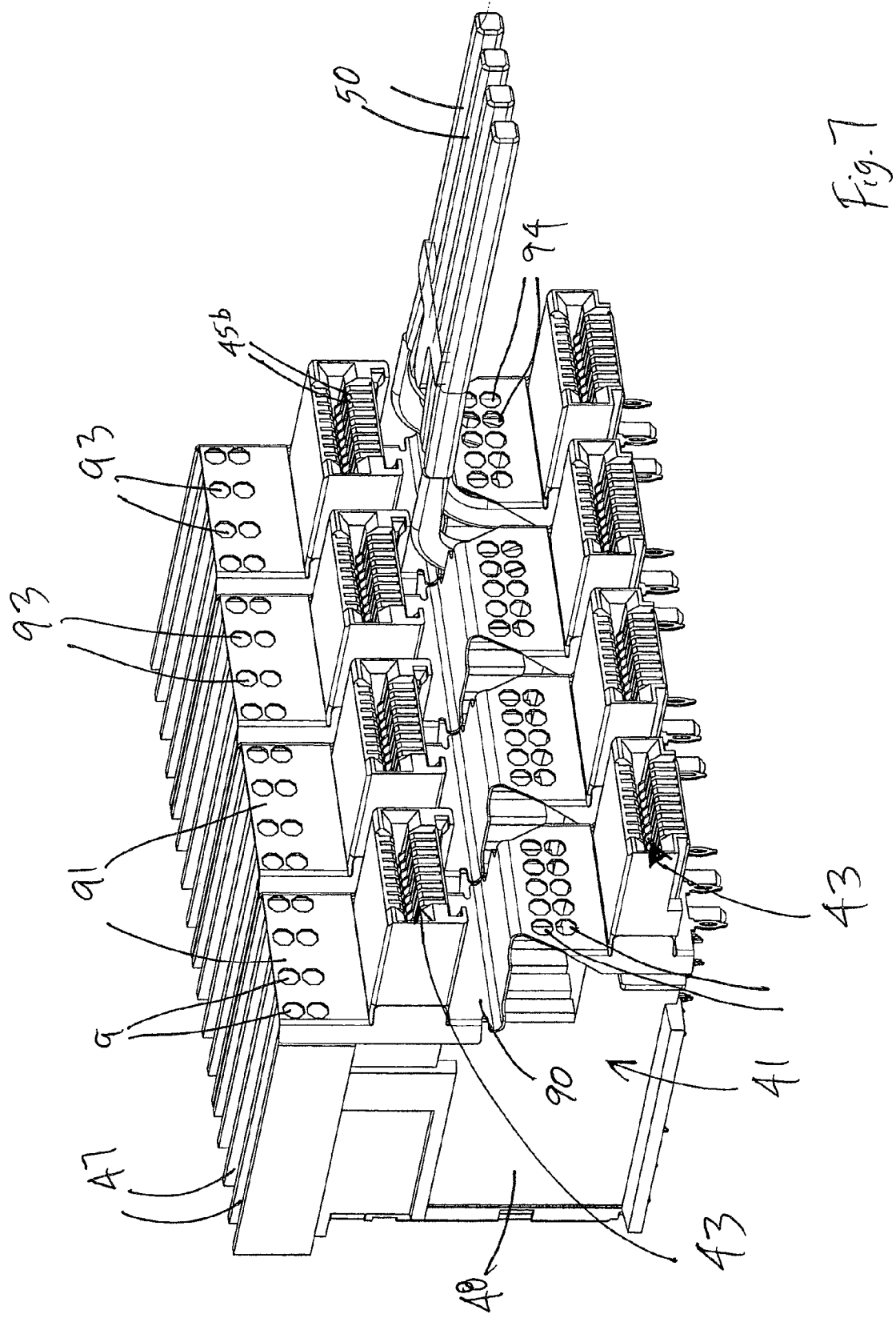
FIG. 7 illustrates a perspective view of an embodiment of a housing and plates.
Figure 8:
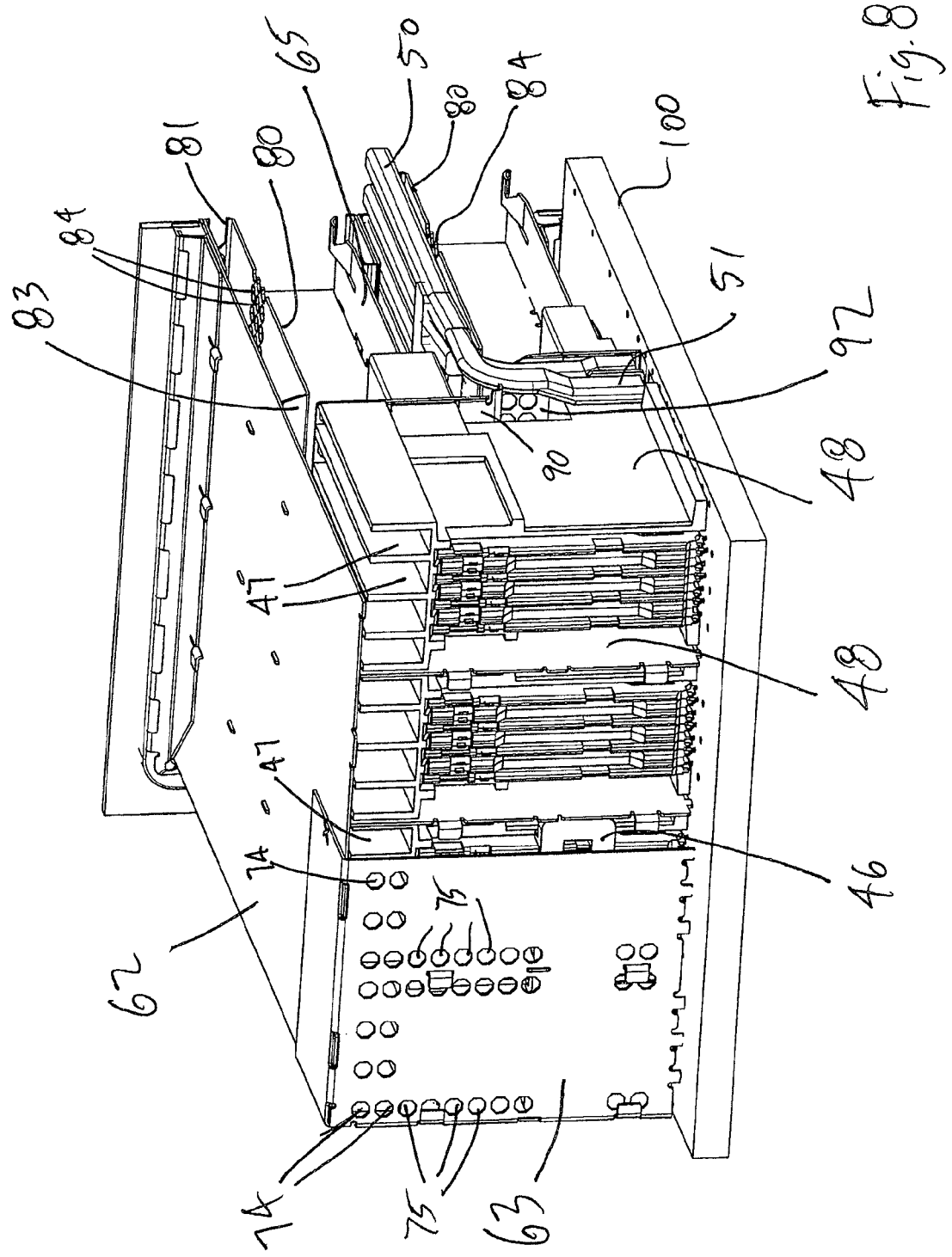
FIG. 8 illustrates a perspective view of a cross section of an embodiment of connector assembly with a portion of a rear wall removed.
Figure 9:
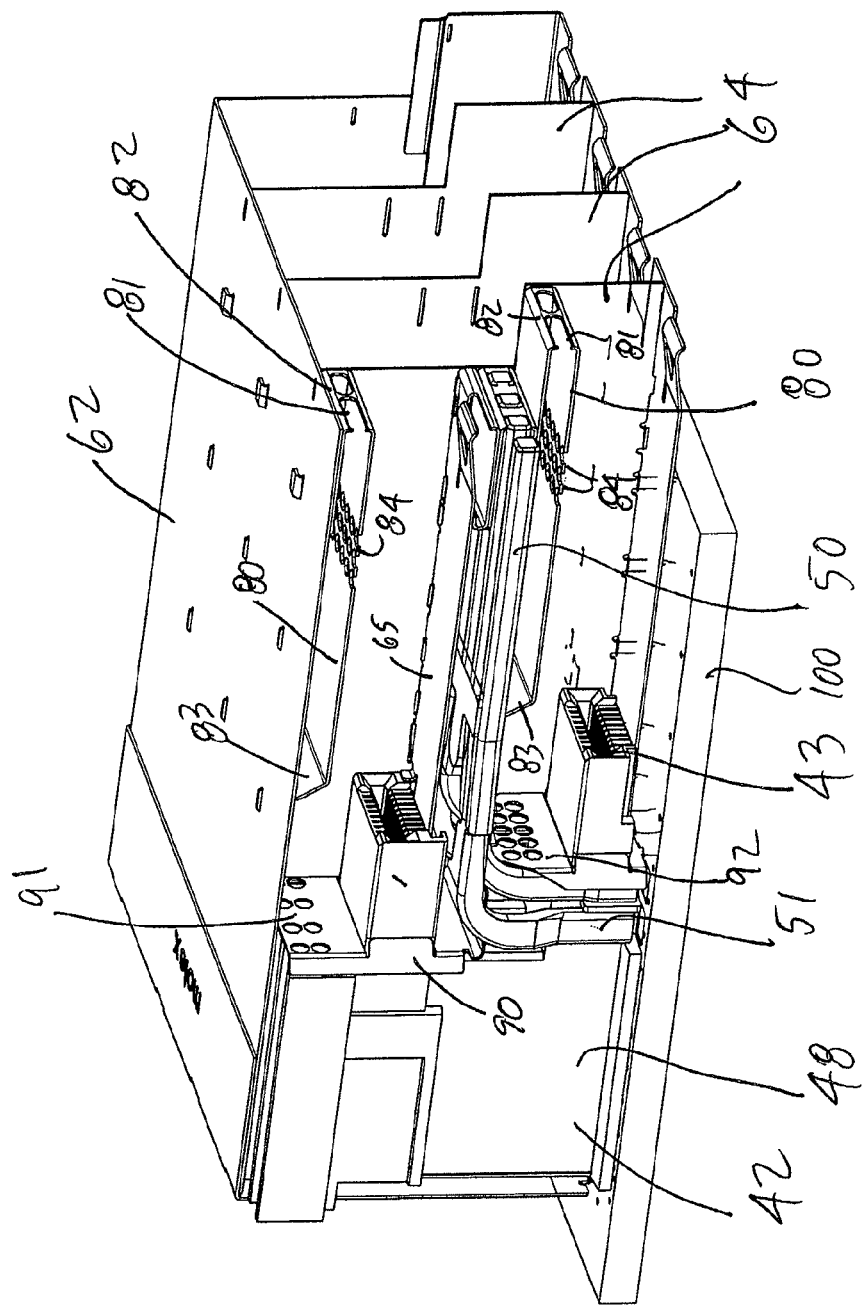
FIG. 9 illustrates a perspective view of a cross section of an embodiment of a connector assembly.

As depicted, each of the top and bottom ports 31a, 31b includes an airflow restriction section 90 for controlling the amount of air that may pass through apertures 74, 75 in rear wall 63, past housing 42 along upper air passages 47 or lateral air channels 48 and out the opening 34 or the openings 81 along the front face 32 of assembly 30. For example, as depicted in FIG. 7, the airflow restriction section is provided by upper and lower plates 91, 92 that are positioned above each of the card slots 43 of the connector 41. As such, upper plate 91 is generally aligned with its upper port 31a and lower plate 92 is generally aligned with its lower port 31b. The upper and lower plates 91, 92 have holes 93, 94, respectively, therein for restricting the amount of air that may flows through a port from the rear wall 63 to the opening 34. More specifically, upper and lower plates 91, 92 serve to limit the rate at which air may pass through assembly 30 so that amount of air that passes through any port 31 will be generally consistent, regardless of whether a module is located each port. If air may flow in an unrestricted manner from rear wall 63 through each port 31 to the front face 32 of assembly 30, in some circumstances, air will tend to flow primarily through unpopulated ports of assembly 30. As a result, airflow and thus cooling will be decreased from those ports having modules therein. Decreased cooling may result in decreased system performance as well as potential damage to the modules.

The upper and lower plates 91, 92 can be configured so as to be the most restrictive aspect of the airflow path. For example, as air enters assembly 30, it can move through apertures 74, 75 in rear wall 63, past housing 42 and encounters the upper and lower plate 91, 92. After passing through the upper and lower plates 91, 92, the air engages the surface 83 of airflow member 80 which redirects the air downward into the front opening 112 and through the module 110. Upon exiting the second opening 113 of the module, the air passes through holes 84 in airflow member 80 and out openings 81 adjacent the front face of assembly 30. By configuring upper and lower plates 91, 92 such that airflow impedance does not increase by more than 50 percent when a module is inserted into one of the ports 31, air will pass through each of the ports of assembly 30 in a generally uniform manner regardless of whether modules are inserted in each port 31. As a result, assembly 30 can provide increased consistency of system cooling regardless of the number of ports having modules 110 therein.

Figure 11:
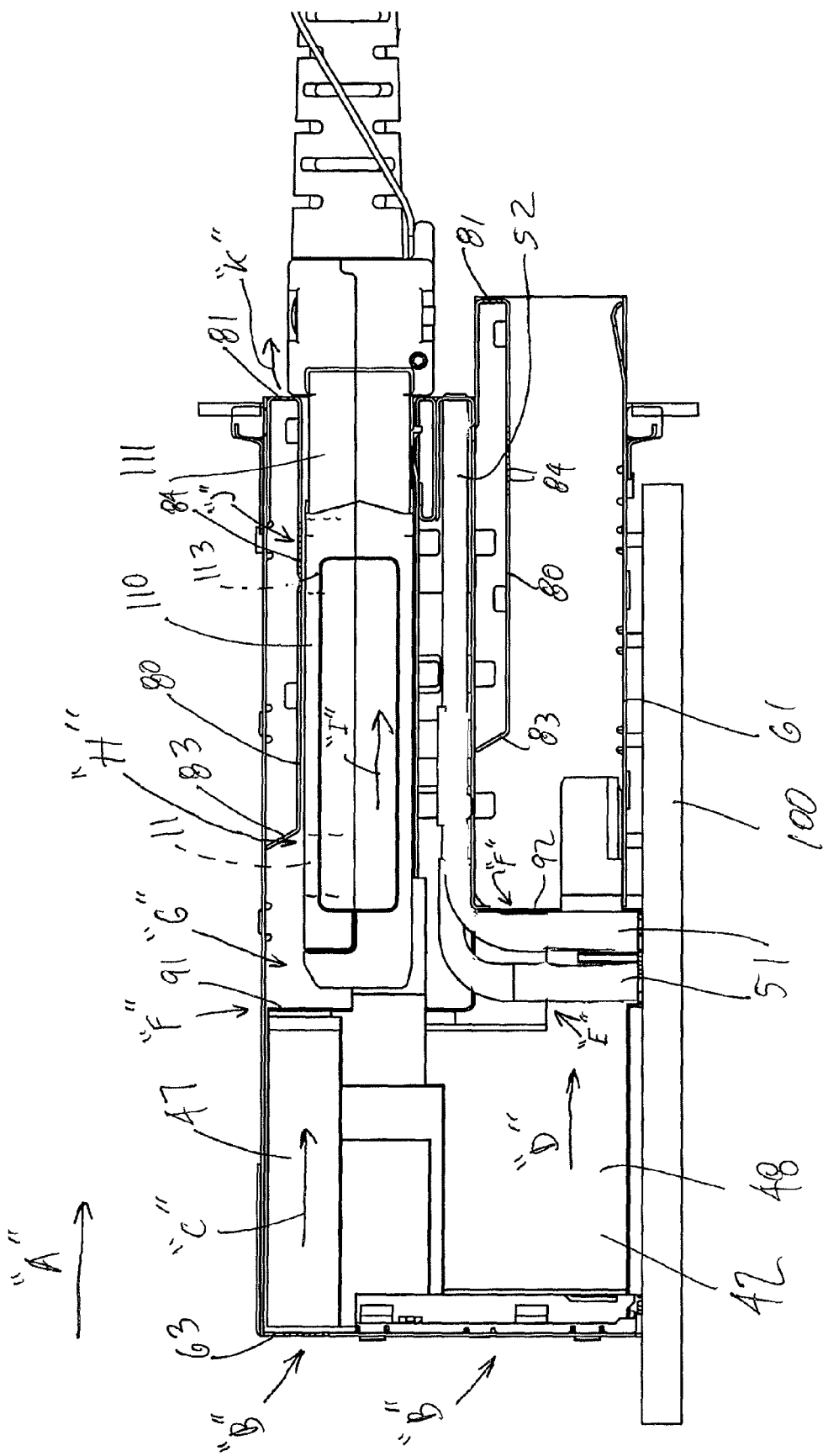
FIG. 11 illustrates an elevated side view of the embodiment depicted in FIG. 10.

Referring to FIG. 11, the assembly 30, as depicted, can be viewed as having several distinct areas along the airflow path. Each will have an impact on the airflow and thus an airflow impedance along the path. For the purposes of this section, it is assumed that airflow will be provided within a data handling device such that the air will flow from the rear of assembly 30 towards the front of the assembly as depicted by arrow "A." It is expected, however, that assembly 30 will function in a similar manner regardless of whether the airflow is back-to-front or front-to-back. Air initially enters holes 74, 75 in rear wall 63 at "B." The airflow is not substantially restricted by these holes and the airflow impedance associated with rear wall 63 is generally small. Airflow past connector housing 42 along the upper channels 47 at "C" is similarly unrestricted and generally aligned with upper port 31a and thus also provides a relatively low airflow impedance. Airflow along the sides of connector housing 42 and through lateral air channels 48 at "D" is also relatively unrestricted and thus also provides a relatively low airflow impedance. However, as the air reaches the vertical portions 51 of the light pipes 50 at "E," the air must flow upwards (FIGS. 8, 11) towards the lower port 31b and thus the airflow impedance along the lower port would be slightly higher than that of the upper port as the air reaches the upper and lower air restriction plates 91, 92. Accordingly, the amount of airflow restriction required by the lower plate 92 may be slightly less than that required for the upper plate 91.

As the air passes the upper and lower plates 91, 92 at "F," it reaches the front edge 114 of module 110 and thus is forced into a smaller area 33 at "G" if a module is inserted in port 31. As the air moves towards front face 32 of assembly 30 in the smaller area 33, it is redirected downward by surface 83 of airflow member 80 and into front opening 112 of module 110 at "H." Both the smaller area 33 and the surface 83 each increase the airflow impedance of the assembly. The air passes through the module 110 at "I" and exits the second opening through holes 84 of airflow member 80 at "J" and out the openings 81 in the front face 32 of assembly 30 at "K."

Each change in airflow from the rear wall 63 to front face 32 of assembly 30 creates a change in airflow impedance. By configuring upper and lower plates 91, 92 so that they provide the sufficiently high airflow impedance through each port, airflow through each port 31 may be controlled and kept relatively consistent. Module 110 will also have an airflow impedance through openings 112, 113. By configuring assembly 30 such that the upper and lower plates 91, 92 have an airflow impedance generally greater than or equal to the airflow impedance of module 110, airflow will not substantially increase through unpopulated ports and thus the cooling of any modules 110 that are inserted within the assembly 30 can be maintained. If desired, it may be possible to restrict the airflow through holes 74, 75 or around connector housing 42 in addition to or rather than restricting the flow of air through upper and lower plates 91, 92. Thus, the airflow restriction section need not be located on one location but could be spread over a distance. In each instance, it may be desirable to create a passive structure that provides a relatively uniform airflow through assembly 30 and ports 31 regardless of whether a module is inserted in a port. Through such a structure, airflow will generally remain constant through the ports regardless of whether a module 110 is inserted in the corresponding port.

It should be noted that provision of a relatively uniform airflow is intended to cover systems that ensure sufficient airflow over a module even if a single module is inserted. In an embodiment, the airflow impedance can be configured so that airflow does not change more than 50% regardless of whether a module is inserted. In another embodiment, the ports can be configured so that airflow does not change more than 30% regardless of whether a module is inserted. As can be appreciated, this can be measured by testing the difference in air pressure drop between an unloaded and a loaded system. For example, in an embodiment where the change is less than 50%, the system can be configured so that air pressure drop across the system will decrease by less than 50% when comparing a system that has modules inserted in every port versus the same system without any modules inserted. Similarly, the same test can be run for a system that is configured to provide less than a 30% difference. It should be noted that decreasing the percentage of change between the case with all modules inserted and no modules inserted will generally cause the overall pressure drop to increase, thus it may not be desirable for certain applications to go below a 30% difference. However, for increased cooling uniformity, a difference of 20%, 10% or even less may be desirable.

Figure 13:
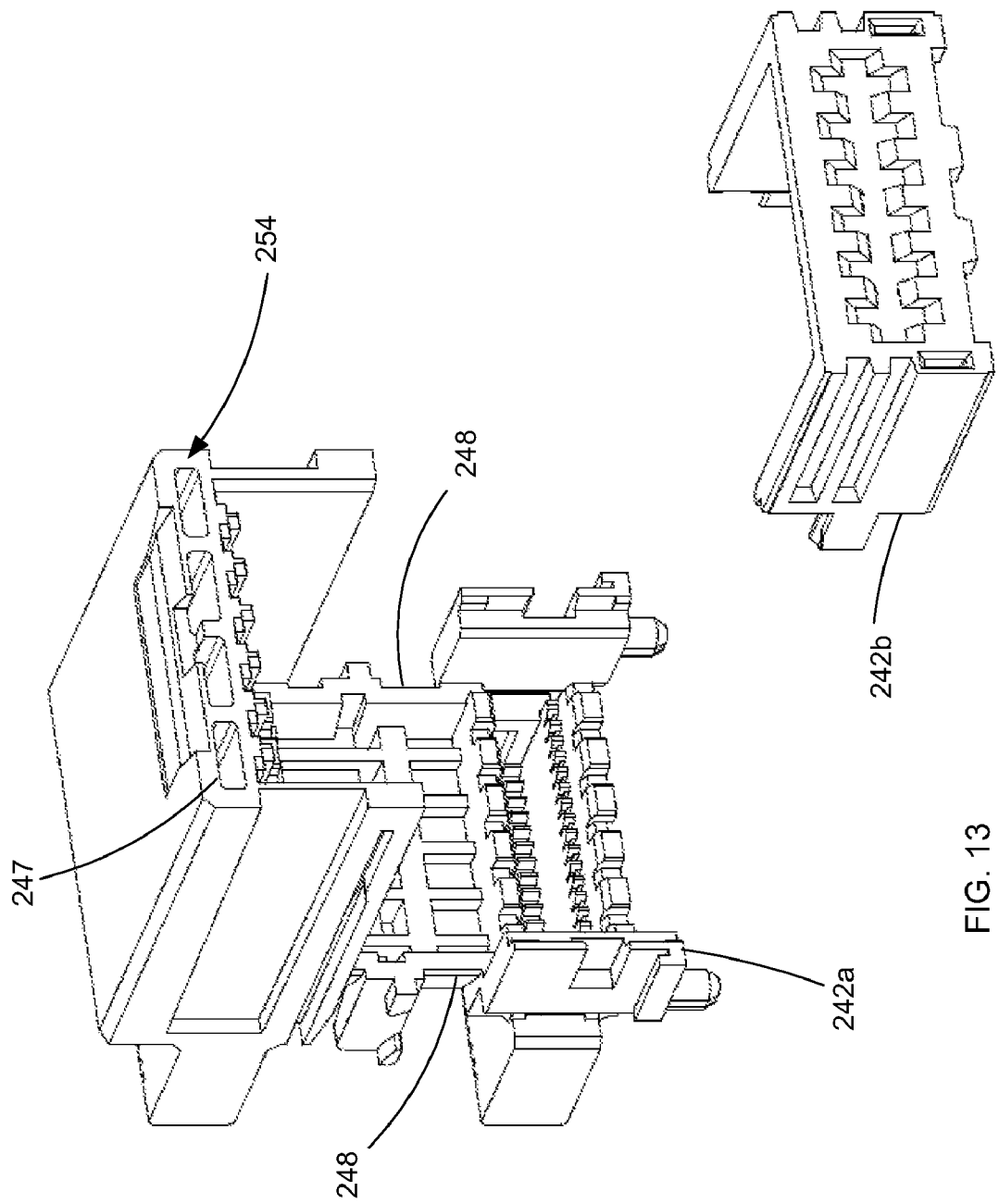
FIG. 13 illustrates another perspective view of the embodiment depicted in FIG. 12.

Another embodiment of a housing 242 that can be provided is depicted in FIG. 12-13. As can be appreciated, the housing 242 includes a first half 242a and a second half 242b. It should be noted, however, that the two-piece construction is optional as the housing can be provided in a one-piece design or more than two piece design if desired.

The housing 242 includes a top surface 253 and an air channel 247 is provided that extends between a front face 252 and a rear face 253 of the housing 242 to provide air for the top port. In addition, air channels 248 are provided on the side to provide air for the bottom port. However, unlike the embodiment depicted in FIG. 4, for example, the air channel 247 is not open on the top. The advantage of having the open air channel is that there is more space for air to flow, which generally will help reduce the air resistance. The advantage of the closed air channel as provided in FIGS. 12-13 is that the housing 242 can have a stronger structure. However, a combination of partially open and partially closed air channels could also be used if desired. Thus, the use of closed or open air channels is not intended to be limiting unless otherwise noted.

It should be noted that the housing 242 does not include a plate in front of the air channels. The use of a plate is beneficial, as discussed above, but can be replaced with structure that provides similar functionality (from an airflow impendence standpoint) where EMI protection is not considered necessary and in those applications the plate can be omitted to help reduce the cost of the assembly. As can be appreciated, therefore, the air channels can be provided with systems that include a plate as well as systems that omit a plate.

As noted above, in certain embodiments it may be desirable to have a non-stacked system (e.g., a 1×N system) rather than a stacked system. Such a system can be configured to allow airflow through the port(s) in a manner that controls the difference in airflow impedance so that the difference in airflow impedance between a system with the module(s) inserted and no module(s) inserted is small enough.

In addition, the above depicted embodiment discloses a module with front and rear openings that allow air to flow through the module. In certain embodiments it may be undesirable to have these openings in the module. In those embodiments, the airflow member 80 can be configured to provide an alternative air passage around the module (rather than through the module). For example, openings could be provided on the surface 83 of the airflow member 80 that would allow air to pass to openings 81. While such a airflow member would obviously provide a greater airflow impedance with a module positioned in the port compared to a system without a module in the port, sufficient airflow impendence between the rear wall of the connector assembly 30 and the port will allow the system to still provide the desired relatively consistent airflow regardless of whether a module is inserted.

Although the disclosure provided has been described in terms of illustrated embodiments, it is to be understood that the disclosure is not to be interpreted as limiting. Various alterations and modifications will no doubt become apparent to those skilled in the art after having read the above disclosure. Accordingly, numerous other embodiments, modifications and variations within the scope and spirit of the appended claims will occur to persons of ordinary skill in the art from a review of this disclosure.

The invention claimed is:

1. A connector assembly, comprising:
a cage, the cage including a front face that has a port with an opening configured to receive an electronic module, the cage including a top wall, two side walls and a rear wall, the rear wall having an aperture configured to allow air to pass therethrough;
a housing positioned in the cage and including an air channel, the housing including a card slot aligned with the port, wherein the aperture and the port are in communication via the air channel so that an air passage is formed between the rear wall and the front face; and
an air restricting section positioned along the air passage to increase airflow impedance along the air passage, the air restricting section having an airflow impedance such that insertion of the electronic module into the opening cause the airflow impendence between the rear wall and the opening to increase by less than 50 percent.

2. The connector assembly of claim 1, wherein the air restricting section is a plate.

3. The connector assembly of claim 1, further comprising an airflow member, the airflow member including openings aligned with the front face and configured to allow, in operation, airflow to pass a module inserted into the port.

4. The connector assembly of claim 3, wherein the airflow member includes a surface configured to allow air to flow through the surface and out the openings of the airflow member.

5. The connector assembly of claim 1, wherein the airflow restriction section is configured so that airflow impedance increases by less than 30 percent when a module is inserted into the opening.

6. A connector assembly, comprising:
a cage having a rear wall and a front face with a first and second ports defined therein;
a housing positioned in the cage, the housing have a card slot aligned with each of the first and second ports;
a first air passage defined between the rear wall and the first port;
a second air passage defined between the rear wall and the second port, wherein the first and second air passages are each configured to provide an airflow impedance that does not increase by more than 50 percent when a module is inserted into the corresponding port.

7. The connector assembly of claim 6, wherein the first air passage travels through a first air channel provided in the housing and the second air passage travels through a second air channel provided in the housing.

8. The connector assembly of claim 6, wherein the housing supports a plurality of wafers, each wafer supporting a plurality of terminals.

9. The connector assembly of claim 8, wherein the first card slot and the second card slot are vertically stacked.

10. The connector assembly of claim 9, wherein one of the plurality of terminals is positioned in the first card slot and another of the plurality of terminals is positioned in the second card slot.

11. The connector assembly of claim 6, wherein a first plate is positioned in the first air passage and a second plate is positioned in the second air passage.

12. The connector assembly of claim 11, wherein the first plate has a first airflow impedance and the second plate has a second airflow impedance and the first airflow impedance is different than the second airflow impedance.

* * * * *